(12) United States Patent
Jiang et al.

(10) Patent No.: US 10,056,427 B1
(45) Date of Patent: Aug. 21, 2018

(54) FRONT SIDE ILLUMINATED IMAGE SENSOR DEVICE STRUCTURE AND METHOD FOR FORMING THE SAME

(71) Applicant: Taiwan Semiconductor Manufacturing Co., Ltd., Hsinchu (TW)

(72) Inventors: Ji-Heng Jiang, Tainan (TW); Ming-Chi Wu, Kaohsiung (TW); Chi-Yuan Wen, Tainan (TW); Chien-Nan Tu, Kaohsiung (TW); Yu-Lung Yeh, Kaohsiung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 6 days.

(21) Appl. No.: 15/609,384

(22) Filed: May 31, 2017

(51) Int. Cl.
  *H01L 27/146* (2006.01)

(52) U.S. Cl.
  CPC .... *H01L 27/14685* (2013.01); *H01L 27/1463* (2013.01); *H01L 27/14612* (2013.01); *H01L 27/14621* (2013.01); *H01L 27/14623* (2013.01); *H01L 27/14627* (2013.01); *H01L 27/14636* (2013.01)

(58) Field of Classification Search
  CPC ............ H01L 27/1462; H01L 27/1463; H01L 27/14623; H01L 27/14612; H01L 27/14627; H01L 27/14621; H01L 27/14636
  See application file for complete search history.

(56) References Cited

U.S. PATENT DOCUMENTS

| | | | |
|---|---|---|---|
| 9,659,981 B2 * | 5/2017 | Ting | H01L 27/146 |
| 2013/0082343 A1 * | 4/2013 | Fudaba | H01L 31/0236 257/432 |
| 2015/0279885 A1 * | 10/2015 | Tu | H01L 27/14621 257/432 |
| 2015/0287761 A1 | 10/2015 | Huang et al. | |
| 2017/0345853 A1 * | 11/2017 | Kato | H01L 27/1463 |

* cited by examiner

*Primary Examiner* — Benjamin Sandvik
*Assistant Examiner* — Gustavo Ramallo
(74) *Attorney, Agent, or Firm* — Birch, Stewart, Kolasch & Birch, LLP

(57) ABSTRACT

An FSI image sensor device structure is provided. The FSI image sensor device structure includes a substrate and a barrier structure formed in the substrate. The barrier structure includes a plurality of protrusion portions and a plurality of pillar portions. Each of the protrusion portions has a first height, and each of the pillar portions has a second height that is greater than the first height. The FSI image sensor device structure includes a pixel region formed over the protrusion portions and a storage region formed over the protrusion portions, wherein the pillar portions surround the pixel region.

20 Claims, 18 Drawing Sheets

FRONT SIDE ILLUMINATED IMAGE SENSOR DEVICE STRUCTURE AND METHOD FOR FORMING THE SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Many integrated circuits are typically manufactured on a single semiconductor wafer, and individual dies on the wafer are singulated by sawing between the integrated circuits along a scribe line. The individual dies are typically packaged separately, in multi-chip modules, for example, or in other types of packaging.

An image sensor is used to convert an optical image focused on the image sensor into an electrical signal. The image sensor includes an array of light-detecting elements, such as photodiodes, and a light-detecting element is configured to produce an electrical signal corresponding to the intensity of light impinging on the light-detecting element. The electrical signal is used to display a corresponding image on a monitor or provide information about the optical image.

Although existing image sensor device structures and methods for forming the same have been generally adequate for their intended purpose they have not been entirely satisfactory in all respects.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 2D' shows a cross-sectional representation of an FSI image sensor device structure, in accordance with some embodiments of the disclosure.

FIG. 5C' shows a cross-sectional representation of an FSI image sensor device structure, in accordance with some embodiments of the disclosure.

DETAILED DESCRIPTION

Figure 1A:
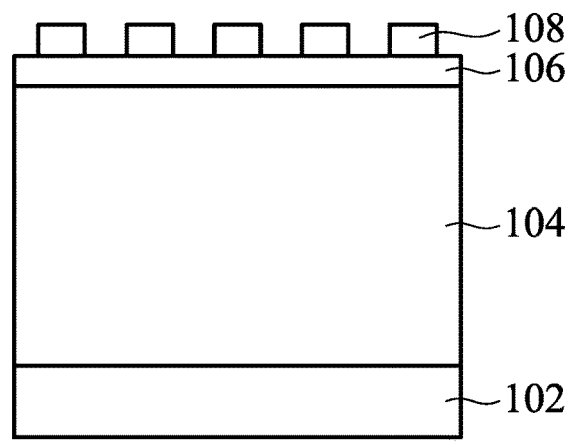
FIGS. 1A-1H show cross-sectional representations of various stages of forming a bottom portion of FSI image sensor device structure, in accordance with some embodiments of the disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Some variations of the embodiments are described. Throughout the various views and illustrative embodiments, like reference numbers are used to designate like elements. It should be understood that additional operations can be provided before, during, and after the method, and some of the operations described can be replaced or eliminated for other embodiments of the method.

Embodiments for a front side illuminated (FSI) image sensor device structure and method for forming the same are provided. FIGS. 1A-1H show cross-sectional representations of various stages of forming a bottom portion of FSI image sensor device structure 100, in accordance with some embodiments of the disclosure. The FSI image sensor device structure includes a barrier structure in a semiconductor layer over a substrate, and the barrier structure includes a number of pillar portions. The pillar portions are formed between a pixel region and a storage region to prevent stray light from affecting the storage region.

Referring to FIG. 1A, a first substrate 102 is provided. The first substrate 102 may be made of silicon or other semiconductor materials. In some embodiments, the first substrate 102 is a wafer. Alternatively or additionally, the first substrate 102 may include other elementary semiconductor materials such as germanium. In some embodiments, the first substrate 102 is made of a compound semiconductor or alloy semiconductor, such as silicon carbide, gallium arsenic, indium arsenide, or indium phosphide, silicon germanium, silicon germanium carbide, gallium arsenic phosphide, or gallium indium phosphide. In some embodiments, the first substrate 102 includes an epitaxial layer. For example, the first substrate 102 has an epitaxial layer overlying a bulk semiconductor.

Afterwards, a semiconductor layer 104 is formed over the first substrate 102. In some embodiments, the semiconductor layer 104 made of silicon (Si) is formed. In some embodiments, the semiconductor layer 104 is formed by an epitaxial process or another applicable process.

Next, a hard mask layer 106 is formed over the semiconductor layer 104, and then a first photoresist layer 108 is formed over the hard mask layer 106. The first photoresist layer 108 is patterned to form a patterned photoresist layer 108. The patterned first photoresist layer 108 is formed by a patterning process. The patterning process includes a photolithography process and an etching process. Examples of a photolithography process include soft baking, mask aligning, exposure, post-exposure baking, developing the photoresist, rinsing and drying (e.g., hard baking). The etching process may be a dry etching or a wet etching process.

Figure 1B:
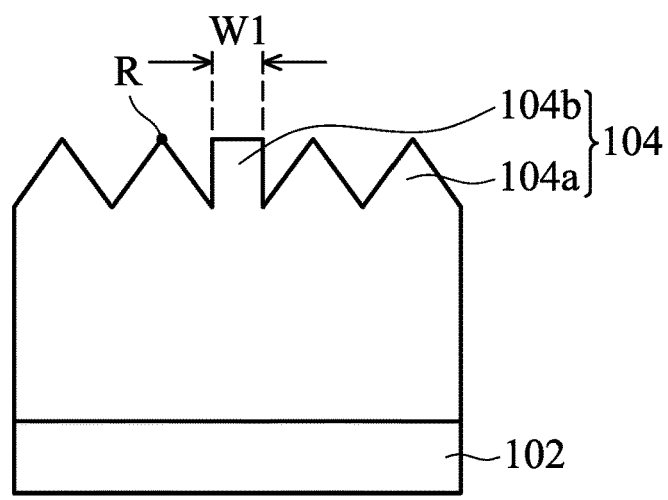

Afterwards, as shown in FIG. 1B, the hard mask layer 106 is patterned and a portion of the semiconductor layer 104 is removed by using the patterned hard mask layer 106 as a mask, in accordance with some embodiments of the disclosure. As a result, the semiconductor layer 104 includes a number of hill portions 104a and a flat portion 104b. The hill portions 104a may have a triangular, conical, concave, wave or trapezoidal shape when seen from a cross-sectional view. In some embodiments, a top surface of the flat portion 104b is level with a tip R of each of the hill portions 104a. The top surface of the flat portion 104b has a first width $W_1$. The hill portions 104a and the flat portion 104b are formed by photolithography processes and etching processes. Examples of a photolithography processes include soft baking, mask aligning, exposure, post-exposure baking, developing the photoresist, rinsing and drying (e.g., hard baking). The etching processes may be a dry etching or a wet etching process.

Figure 1C:
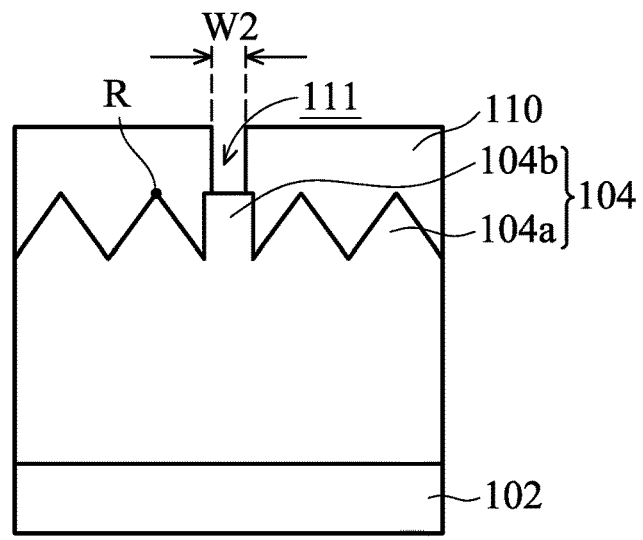

Afterwards, as shown in FIG. 1C, a second photoresist layer 110 is formed over the semiconductor layer 104, in accordance with some embodiments of the disclosure. Next, a portion of the second photoresist layer 110 is removed to form an opening 111. The opening 111 has a second with $W_2$ which is smaller than the first width $W_1$. As a result, a portion of the flat portion 104b is exposed by the opening 111, and a remaining second photoresist layer 110 is left to cover the hill portions 104a of the semiconductor layer 104 and another portion of the flat portion 104b.

Figure 1D:
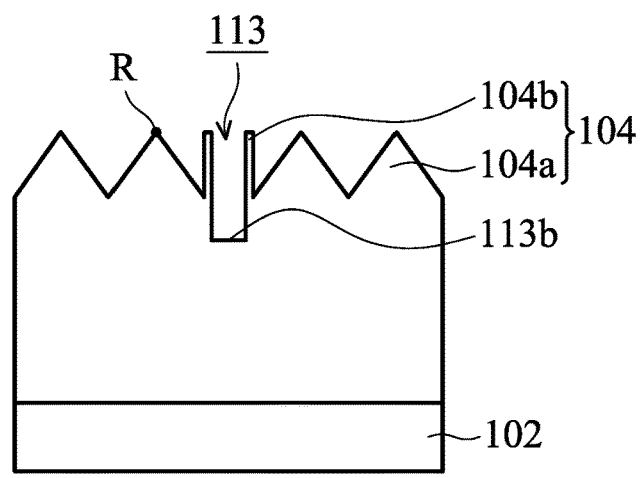

Afterwards, as shown in FIG. 1D, an etching process is performed to remove a portion of the exposed flat portion 104b and to form a trench 113, in accordance with some embodiments of the disclosure. The sidewall portions of the flat portion 104b are left, but the middle portion of the flat portion 104b is removed to form the trench 113. The remaining flat portion 104b is formed to have U-shaped structure when seen form a cross-sectional view. The bottom surface 113b of the trench 113 is lower than the tip R of the hill portions 104a of the semiconductor layer 104. The bottom surface 113b of the trench 113 is a planar surface.

Figure 1E:
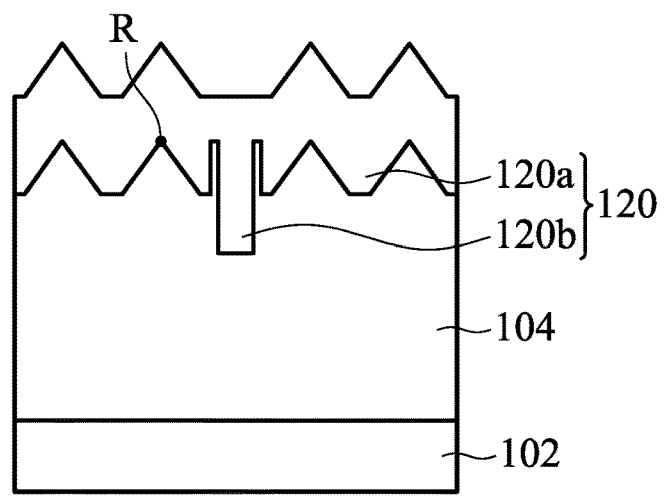

Next, as shown in FIG. 1E, a dielectric layer 120 is formed in the trench 113 and over the hill portions 104a of the semiconductor layer 104, in accordance with some embodiments of the disclosure. A portion of the dielectric layer 120 which is formed in the trench 113 forms the pillar portion 120b, and another portion of the dielectric layer 120 which is formed over the hill portions 104a forms the protrusion portion 120a. The dielectric layer 120 is conformally formed over the semiconductor layer 104, and the shape of the dielectric layer 120 is followed the shape of the semiconductor layer 104. Therefore, the dielectric layer 120 forms a continuous structure when seen from a cross-sectional view.

As shown in FIG. 1E, the dielectric layer 120 includes a number of protrusion portions 120a and a pillar portion 120b adjoined to the protrusion portions 120a. The pillar portion 120b is extended from the protrusion portions 120a in a vertical direction.

Figure 2A:
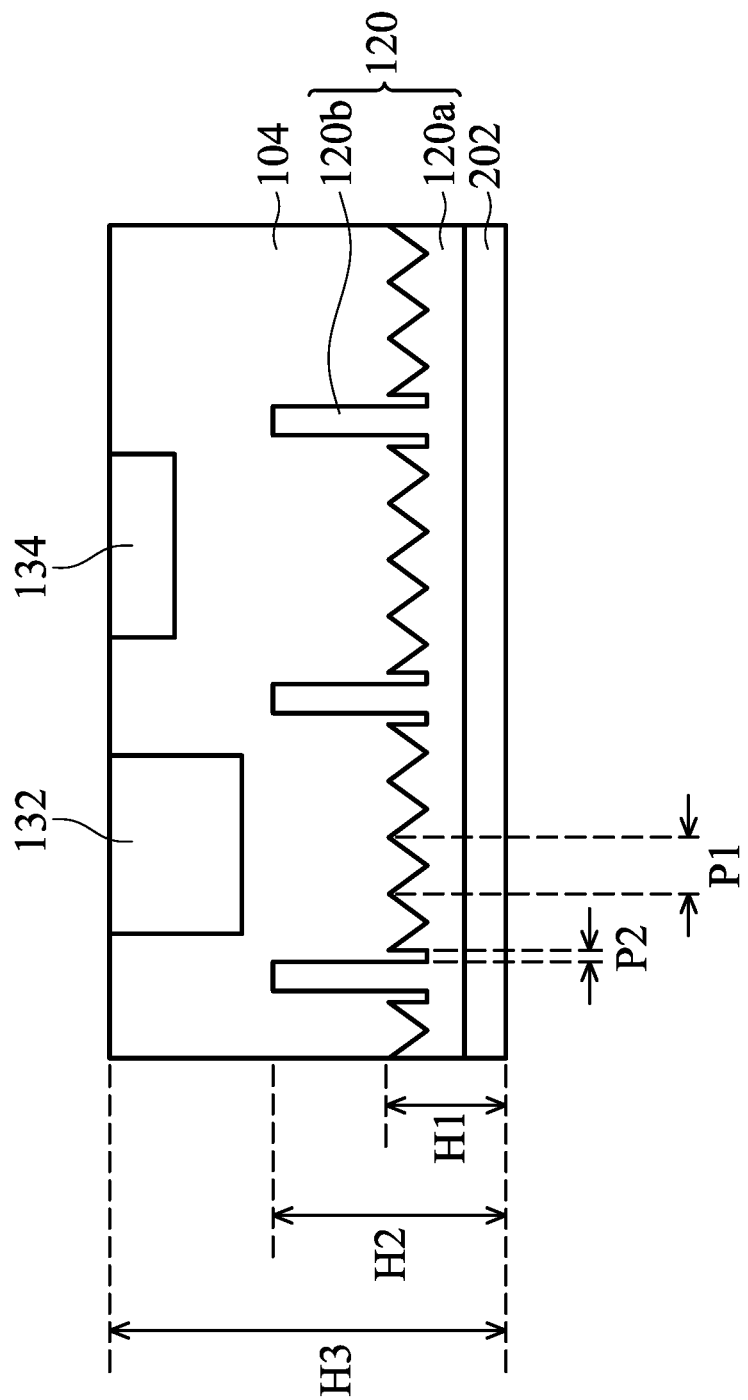
FIGS. 2A-2D show cross-sectional representations of various stages of forming an FSI image sensor device structure, in accordance with some embodiments of the disclosure.
Figure 2B:
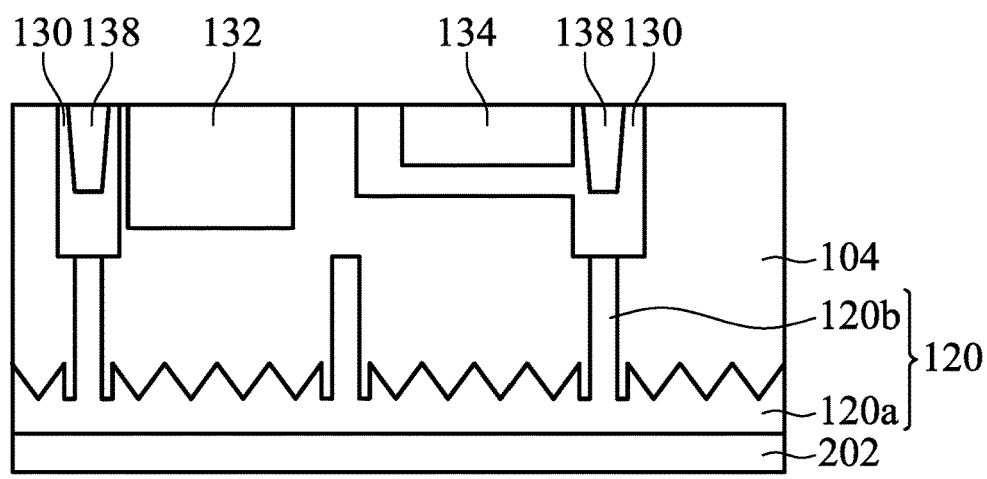

The dielectric layer 120 is configured to reflect the light and then reflected light can be directed into the pixel region 132 (shown in FIG. 2B). In some embodiments, the dielectric layer 120 is made of silicon oxide, silicon nitride, or silicon oxynitride, another applicable material, or a combination thereof. In some other embodiments, the dielectric layer 120 is made of high-k dielectric material. In some embodiments, the dielectric constant (k) of the dielectric layer 120 is greater than about 6. In some embodiments, the dielectric constant (k) of the dielectric layer 120 is in a range from about 10 to about 60. In some embodiments, the dielectric layer 110 includes one or more of high k dielectric materials, such as Tantalum pentoxide ($Ta_2O_5$), Titanium dioxide ($TiO_2$), Hafnium oxide ($HfO_2$), Zirconium dioxide ($ZrO_2$), Aluminum oxide ($Al_2O_3$), Lanthanum oxide ($La_2O_3$), Praseodymium Oxide ($Pr_2O_3$) or Yttrium oxide ($Y_2O_3$). In some embodiments, the dielectric layer 120 is formed by a deposition process, such as a chemical vapor deposition (CVD) process, a physical vapor deposition (PVD) process, an atomic layer deposition (ALD) process or another applicable process.

Figure 1F:
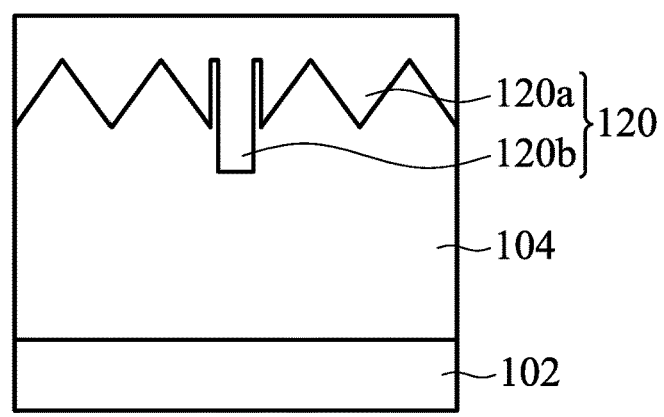

Afterwards, as shown in FIG. 1F, the dielectric layer 120 is planarized to form a planar top surface, in accordance with some embodiments of the disclosure. In some embodiments, the dielectric layer 120 is planarized by a chemical mechanical polishing (CMP) process to have a planar top surface.

Figure 1G:
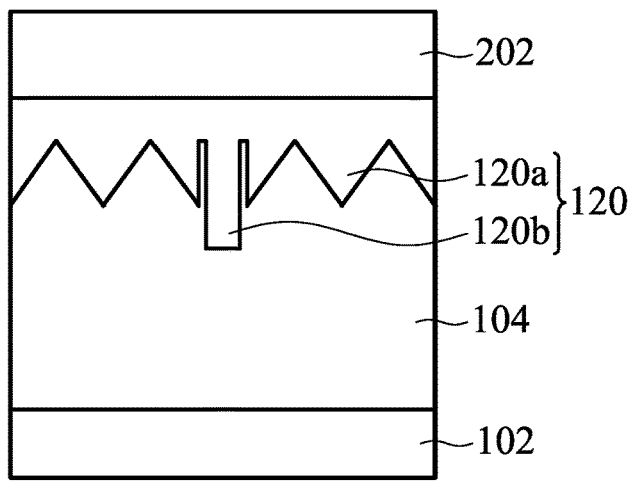

Next, as shown in FIG. 1G, a second substrate 202 is formed over the planar top surface of the dielectric layer 120, in accordance with some embodiments of the disclosure. In some embodiments, the second substrate 202 is made of silicon (Si) or glass wafer. In some embodiments, the second substrate 202 may include other elementary semiconductor materials such as germanium (Ge). In some embodiments, the second substrate 202 is bonded to the dielectric layer 120 by any suitable operation, such as oxide-to-oxide fusion bonding, adhesive bonding, vacuum bonding, anodic bonding or another applicable process.

Figure 1H:
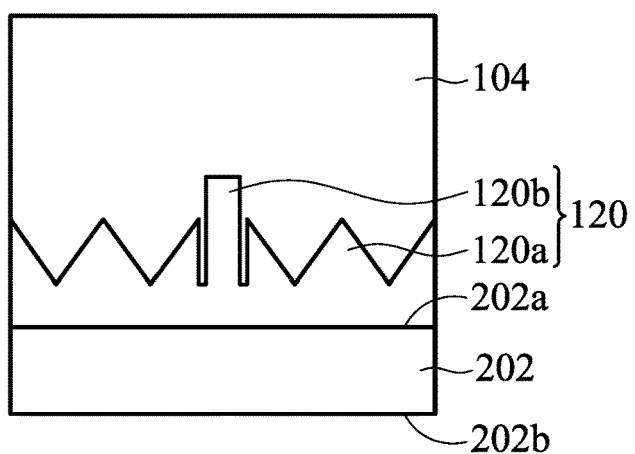

Afterwards, as shown in FIG. 1H, the second substrate 202 is flipped, in accordance with some embodiments of the disclosure. After flipping the second substrate 202, the first substrate 102 is disposed at a top while the second substrate 202 is disposed at a bottom. As a result, the second substrate 202 has a first surface 202a (or front side 202a) facing upward and a bottom surface 202b (or backside 202b) facing downward. The flipping of the second substrate 202 facilitates subsequent operations on the first surface 202a of the second substrate 202. In some embodiments, the flipping is performed by any suitable tool, such as a clamp, gripper, etc.

Afterwards, the first substrate 102 is removed to expose the semiconductor layer 104. In addition, a portion of the dielectric layer 104 is removed. In some embodiments, the first substrate 102 is removed by a planarizing process, such as a chemical mechanical polishing (CMP) process.

As shown in FIG. 1H, the dielectric layer 120 is formed over the first surface 202a of the second substrate 202. The protrusion portions 120a and the pillar portion 120b form a continuous structure. The protrusion portions 120a have a triangular, conical, concave, wave or trapezoidal shape when seen from a cross-sectional view. The pillar portions 120b have a rectangular shape when seen from a cross-sectional view. A top surface of the pillar portion 120b is higher than a top surface of the protrusion portions 120a. The pillar portion 120b is extended above the protrusion portions 120a. A bottom surface of the pillar portions 120b is level with the bottom surfaces of the protrusion portions 120a.

FIGS. 2A-2D show cross-sectional representations of various stages of forming an FSI image sensor device structure 100, in accordance with some embodiments of the disclosure.

The dielectric layer 120 and the second substrate 202 shown in FIG. 2A are formed by the processes shown in FIGS. 1A-1H. The dielectric layer 120 is formed over the second substrate 202 and has a number of protrusion portions 120a and a number of pillar portions 120b. A pixel region 132 and a storage region 134 are formed in the semiconductor layer 104. The pixel region 132 is formed above the protrusion portions 120a, and the storage region 134 is formed adjacent to the pixel region 132. The pixel region 132 may include photosensitive elements. The photosensitive elements may include a photodiode, a partially pinned photodiode, a pinned photodiode, or a photocapacitor. The pixel region 132 may be a doped region doped with n-type and/or p-type dopants. The pixel region 132 may be formed by an ion implantation process, a diffusion process or another applicable process.

When the light enters into the pixel region 132, the pixel region 132 generates electrons proportional to an amount of light falling on the pixel region 132. The electrons are converted into a voltage signal in the pixel region 132 and further transformed into digital signal. The storage region 134 is capable of temporarily storing charge transferred from the pixel region 132.

When the FSI image sensor device structure 100 is operated in global shutter mode, the pixel region 132 is configured to detect the incoming light and the storage region 134 is configured to temporarily store charge. The storage region 134 should not be exposed to incoming light. However, unwanted stray light may strike the storage region 134 adjacent to the pixel region 132, and result in undesired crosstalk and reduction in global shutter efficiency.

In order to prevent the light entering into the storage region 134, the dielectric layer 120 (or called barrier structure) is designed to have the protrusion portions 120a and the pillar portions 120b. The protrusion portions 120a and the pillar portions 120b are reflective to reflect the light to the pixel region 132. The pillar portions 120b surround the pixel region 132. Therefore, the pixel region 132 is separated from the storage region 134 by the pillar portions 120b since the incoming light is blocked by the pillar portions 120b. The dielectric layer 120 (or the barrier structure) performs the function of reflecting the incident light and preventing stray light from entering the storage region 134. Accordingly, the quantum efficiency of the FSI image sensor device structure 100 is improved and crosstalk is reduced. Furthermore, the global shutter efficiency of the FSI image sensor device structure 100 is increased.

In some embodiments, the protrusion portions 120a are consistently spaced from each other. In some embodiments, each of the protrusion portions 120a has substantially the same size, dimensions and shape. A first pitch P1 is formed between two adjacent protrusion portions 120a. In some embodiments, the first pitch P1 is in a range from about 20 nm to about 2000 nm. A second pitch P2 is formed between a sidewall of the protrusion portions 120a and a sidewall of the pillar portion 120b. The second pitch P2 is smaller than the first pitch P1. In some embodiments, the second pitch P2 is in a range from about 0.1 nm to about 500 nm.

Each of the protrusion portions 120a has a first height H1, and the pillar portion 120b has a second height H2 which is greater than the first height H1. The semiconductor layer 104 has a third height H3 measured from a top surface of the semiconductor layer 104 to the first surface 202a of the second substrate 202. In some embodiments, a ratio of the second height H2 of the pillar portions 120b to the third height H3 is in a range from about 0.3 to about 0.9. When the height ratio (H2/H3) is within above-mentioned range, the quantum efficiency of the FSI image sensor device structure 100 is improved and crosstalk is reduced. Furthermore, the global shutter efficiency of the FSI image sensor device structure 200 is increased.

Afterwards, as shown in FIG. 2B, an isolation structure 138 and a well region 130 are formed in the dielectric layer 104, in accordance with some embodiments of the disclosure.

The isolation structure 138 may define and isolate various integrated circuit devices. The isolation structure 138 may be shallow trench isolation (STI) structures or local oxidation of silicon (LOCOS) structures. In some embodiments, the isolation structure 138 is formed in the well region 130. In some embodiments, the isolation structure 138 is aligned with the pillar portions 120b.

The well region 130 is formed above the dielectric layer 120. The well region 130 is doped region having n-type and/or p-type dopants. In some embodiments, the well region 130 is doped with p-type dopants. The doped regions may be formed by an ion implantation process, a diffusion process or another applicable process.

In some embodiments, the well region 130 surrounds the storage region 134, and the pillar portions 120b are in direct contact with the well region 130. More specifically, the top surfaces of the pillar portions 120b are level with the bottom surface of the well region 130. The well region 130 and the pillar portions 120b form a continuous barrier wall to prevent light from passing through the gap between the well region 130 and the pillar portions 120b. In some other embodiments, a portion of the pillar portions 120b is embedded in the well region 130.

Figure 2C:
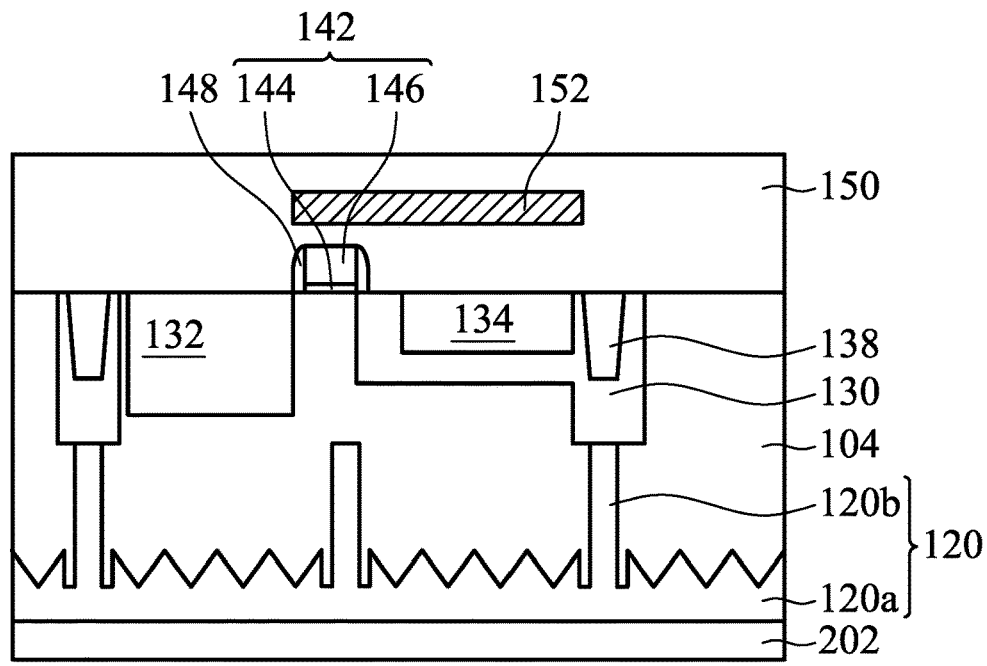

Afterwards, as shown in FIG. 2C, a transistor structure 142 and an inter-layer dielectric (ILD) layer 150 are formed over the transistor structure 142, in accordance with some embodiments of the disclosure. The transistor structure 142 is formed between the pixel region 132 and the storage region 134.

The transistor structure 142 includes a gate dielectric layer 144 and a gate electrode layer 146 over the gate dielectric layer 142, and the gate spacers 148 are formed on sidewalls of the gate electrode layer 144. In some embodiments, the transistor structure 142 is a transfer gate structure. The boundary of the pixel region 132 is substantially aligned with an outer surface of the gate spacers 148.

The gate dielectric layer 144 may be a single layer or multiple layers. The gate dielectric layer 144 may be made of silicon oxide (SiOx), silicon nitride (SixNy), silicon oxynitride (SiON), dielectric material(s) with high dielectric constant (high-k), or a combination thereof. In some embodiments, the gate dielectric layer 144 is formed by a deposition process, such as a chemical vapor deposition (CVD) process, a plasma enhanced chemical vapor deposition (PECVD) process, a spin coating process or another applicable process.

The gate electrode layer 146 may be made of conductive material, such as aluminum (Al), copper (Cu), tungsten (W), titanium (Ti), tantalum (Ta), or other applicable materials. The gate electrode layer 146 may be formed by a deposition process, such as a chemical vapor deposition (CVD), a physical vapor deposition (PVD), an atomic layer deposition (ALD), or another applicable process.

The gate spacers 148 may be made of silicon oxide, silicon nitride, silicon oxynitride or other applicable material. In some embodiments, the gate spacers 148 are formed by a chemical vapor deposition (CVD) process or a physical vapor deposition (PVD) process or another applicable process.

The ILD layer 150 may include multilayers made of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. The ILD layer 150 may be formed by chemical vapor deposition (CVD), physical vapor deposition, (PVD), atomic layer deposition (ALD), spin-on coating, or another applicable process.

Next, a shield structure 152 is formed in the ILD layer 150. The shield structure 152 is configured to prevent stray light from entering into the storage region 134. In some embodiments, the shield structure 152 covers the storage region 134. In addition, the shield structure 152 covers the transistor structure 142. The pillar portions 120b surround the shield structure 152.

The shield structure 152 is made of conductive materials, such as metal. The metal includes tungsten (W), copper (Cu), aluminum (Al), titanium (Ti), tantalum (Ta), nickel (Ni), silver (Ag), gold (Au), indium (In), tin (Sn) or a combination thereof. In some embodiments, the shield structure 152 is formed by electro-plating, electroless plating, sputtering, chemical vapor deposition (CVD) or another applicable process.

Figure 2D:
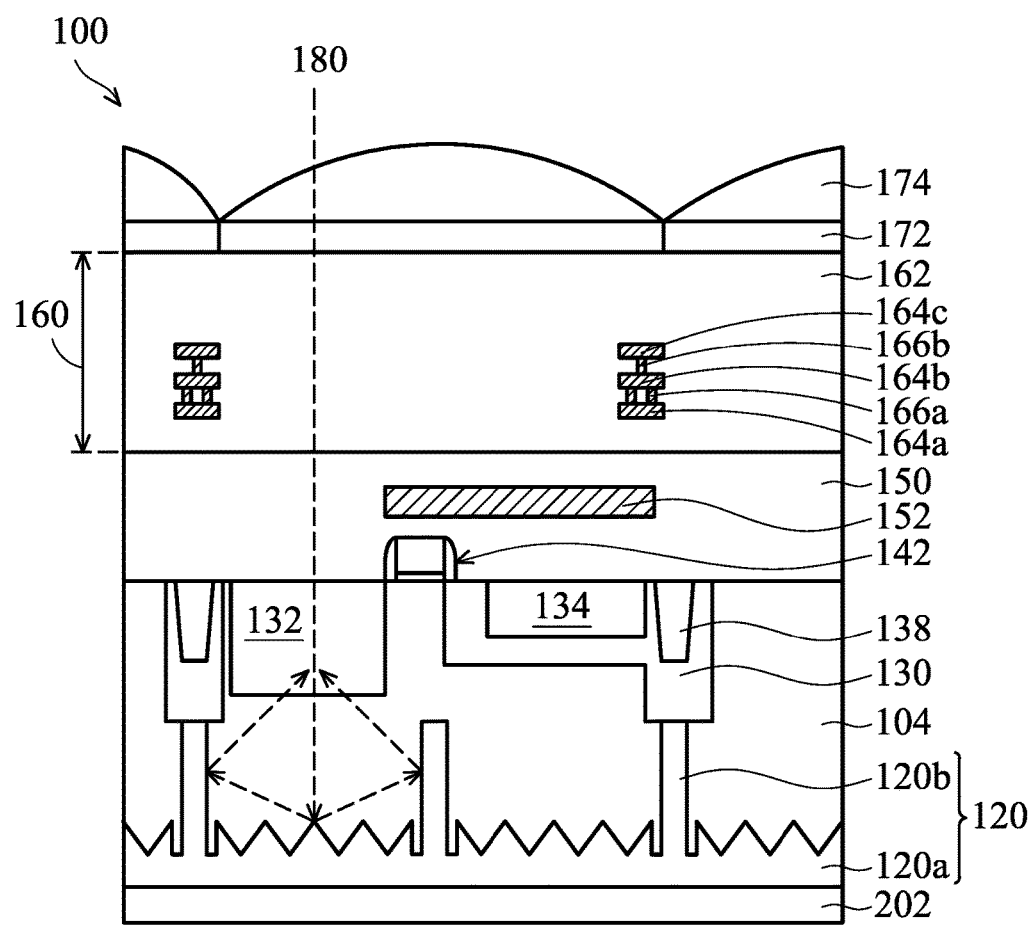
Figure 2D:
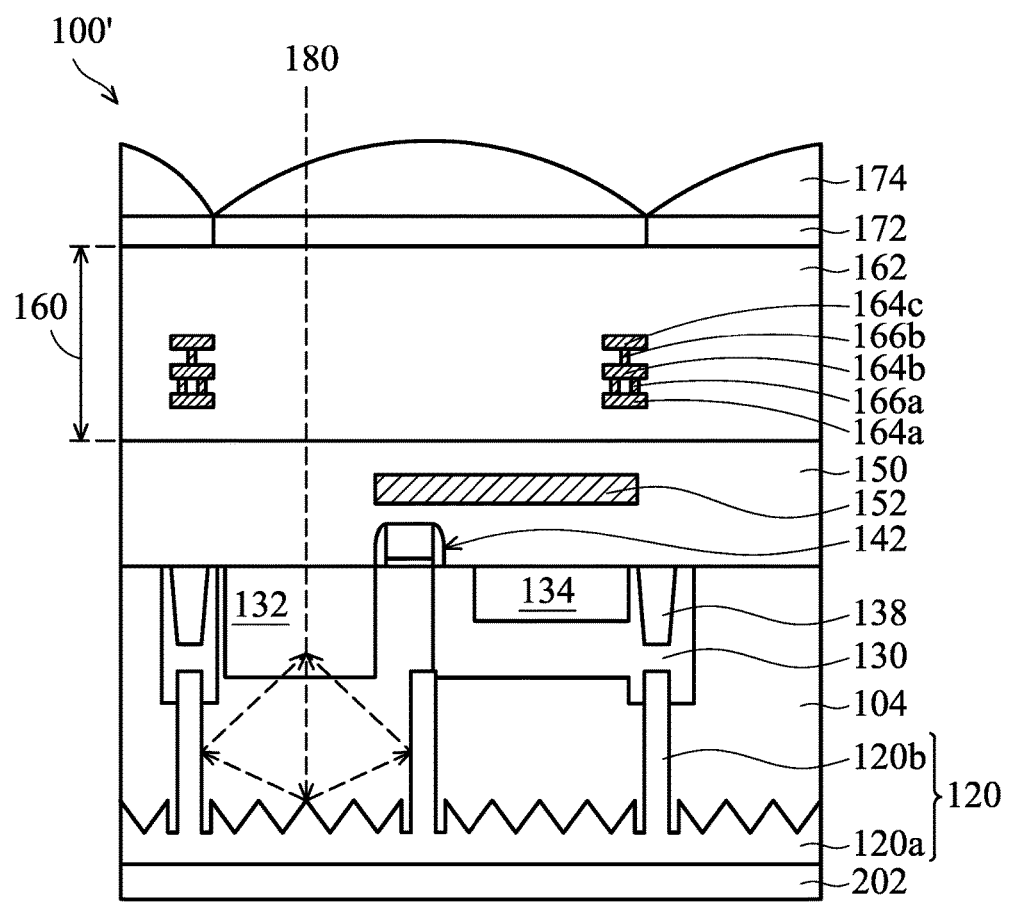

Afterwards, as shown in FIG. 2D, an interconnect structure 160 is formed over the ILD layer 150, in accordance with some embodiments of the disclosure. The interconnect structure 160 is used to electrically connect the signal of the transistor structure 142 to external environment.

The interconnect structure 160 includes multiple conductive features formed in the dielectric layer 162 (such as inter-metal dielectric, IMD). The dielectric layer 162 includes a multiple dielectric layers. The dielectric layer 162 may include silicon oxide, silicon oxynitride, borosilicate glass (BSG), phosphoric silicate glass (PSG), borophosphosilicate glass (BPSG), fluorinated silicate glass (FSG), low-k material, porous dielectric material, or a combination thereof. In some embodiments, the dielectric layer 162 is formed by a chemical vapor deposition (CVD) process, a spin-on process, a sputtering process, or a combination thereof.

In some embodiments, the dielectric layer 162 is made of an extreme low-k (ELK) dielectric material with a dielectric constant (k) less than about 2.5. With geometric size shrinking as technology nodes advance to 30 nm and beyond, ELK dielectric material is used to minimize device RC (time constant, R: resistance, C: capacitance) delay. In some embodiments, ELK dielectric materials include carbon doped silicon oxide, amorphous fluorinated carbon, parylene, benzocyclobutenes (BCB), polytetrafluoroethylene (PTFE) (Teflon), or silicon oxycarbide polymers (SiOC). In some embodiments, ELK dielectric materials include a porous version of an existing dielectric material, such as hydrogen silsesquioxane (HSQ), porous methyl silsesquioxane (MSQ), porous polyarylether (PAE), or porous silicon oxide ($SiO_2$).

The conductive features include a number of conductive lines 164a, 164b and 164c and a number of conductive vias 166a and 166b. Each of the conductive lines 164a, 164b and 164c is electrically connected to the one of the conductive vias 166a and 166b. The conductive lines 164a, 164b and 164c are electrically connected to the transistor structure 142 through a contact structure (not shown). In some embodiments, the conductive lines 164a, 164b and 164c are directly above the pillar portions 120b. Furthermore, the conductive lines 164a, 164b and 164c are not directly above the pixel region 132 since the light will be blocked by the conductive lines 164a, 164b and 164c, and the conductive vias 166a and 166b.

In some embodiments, the first conductive line 164a is called a first metal layer ($M_1$), the second conductive line 164b is called a second metal layer ($M_2$), and the third conductive line 164c is called a third metal layer ($M_3$).

In some embodiments, the conductive features are made of metal materials, such as copper (Cu), aluminum (Al), titanium (Ti), tantalum (Ta), nickel (Ni), silver (Ag), gold (Au), indium (In), tin (Sn) or a combination thereof. In some embodiments, the conductive features are formed by electroplating, electroless plating, sputtering, chemical vapor deposition (CVD) or another applicable process.

The conductive lines 164a, 164b and 164c and the conductive vias 166a and 166b illustrated are exemplary, and the actual positioning and configuration of the conductive lines 164a, 164b and 164c and the conductive vias 166a and 166b may vary according to actual application.

Afterwards, a color filter layer 172 is formed over the interconnect structure 160, and a microlens structure 174 is formed over the color filter layer 172, in accordance with some embodiments of the disclosure. The color filter layer 172 aligned with the pixel region 132 is configured to filter visible light and allow light in the specific wavelength to pass through the dielectric layer 162 of the interconnect structure 160 to the pixel region 104.

The color filter layer 172 may be made of dye-based (or pigment-based) polymer for filtering out a specific frequency band (for example, a desired wavelength of light). In some other embodiments, the color filter layer 172 is made of resins or other organic-based materials having color pigments.

In some embodiments, the microlens structure 174 has a curved upper surface. The microlens structure 174 may have different shapes and sizes depending on the index of refraction of the material used for the microlens structure 174.

As shown in FIG. 2D, a light 180 is disposed over the microlens structure 174. The microlens structures 174 direct the light 180 to the respective the color filter layer 172. Then, the light 180 passes through the color filter layer 172 to the corresponding pixel region 132. A portion of the light 180 passes into the semiconductor layer 104, and reaches the protrusion portions 120a, and the light 180 is reflected by the protrusion portions 120a. The light 180 is then blocked and reflected by the pillar portions 120b, and finally the light is reflected back to and collected by the pixel region 132. Since the light 180 is blocked and reflected by the pillar portions 120b and the pillar portions 120b, the stray light will not enter into the storage region 134.

Figure 3:
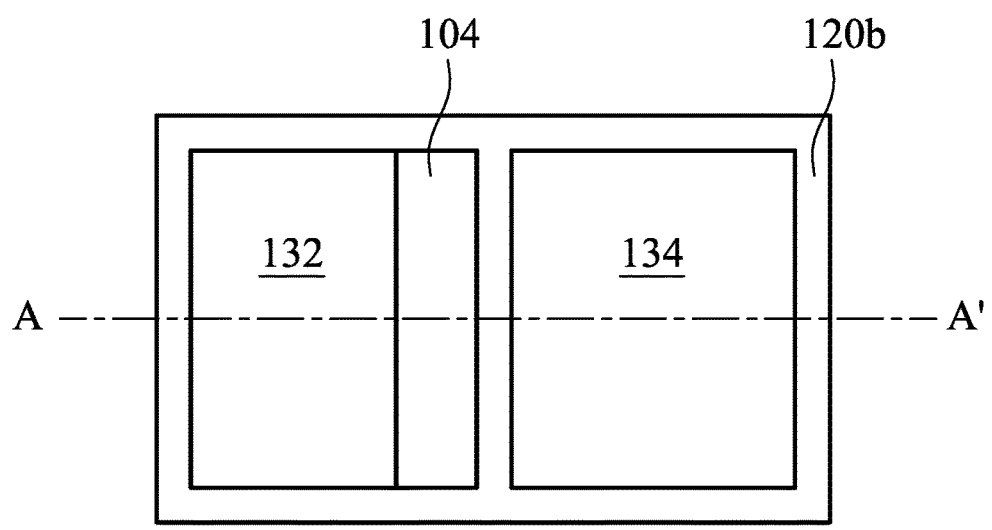
FIG. 3 shows a top view representation of the structure of FIG. 2A, in accordance with some embodiments of the disclosure.

FIG. 3 shows a top view representation of the structure of FIG. 2A, in accordance with some embodiments of the disclosure. FIG. 2A is a cross-sectional representation taken along the AA' line of FIG. 3.

The pillar portions 120b form a ring-shaped structure when seen from a top-view to isolate the pixel region 132 and the storage region 134. In some embodiments, the pillar portions 120b surround the pixel region 132. In some other embodiments, the pillar portions 120b surround the storage region 134.

FIG. 2D' shows a cross-sectional representation of an FSI image sensor device structure 100', in accordance with some embodiments of the disclosure. Some processes and materials used to form the FSI image sensor device structure shown in FIG. 2D' are similar to, or the same as, those used to form the FSI image sensor device structure shown in FIG. 2D and are not repeated herein. The difference between FIG.

2D' and FIG. 2D is that a portion of the pillar portions 120b is embedded in the well region 130. In other words, a portion of the pillar portions is in direct contact with the well region 10.

FIGS. 4A-4H show cross-sectional representations of various stages of forming a bottom portion of an FSI image sensor device structure 200, in accordance with some embodiments of the disclosure. Some processes and materials used to form the FSI image sensor device structure 100 are similar to, or the same as, those used to form the FSI image sensor device structure 200 and are not repeated herein.

Figure 4A:
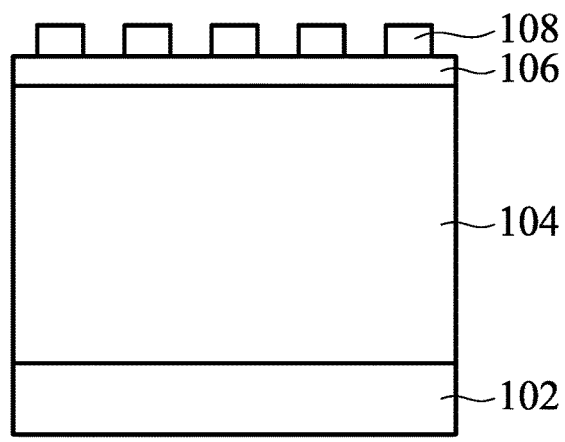
FIGS. 4A-4H show cross-sectional representations of various stages of forming a bottom portion of an FSI image sensor device structure, in accordance with some embodiments of the disclosure.

As shown in FIG. 4A, the semiconductor layer 104 is formed over the first substrate 102, and the hard mask layer 106 is formed over the semiconductor layer 104. The first photoresist layer 108 is formed over the hard mask layer 106.

Figure 4B:
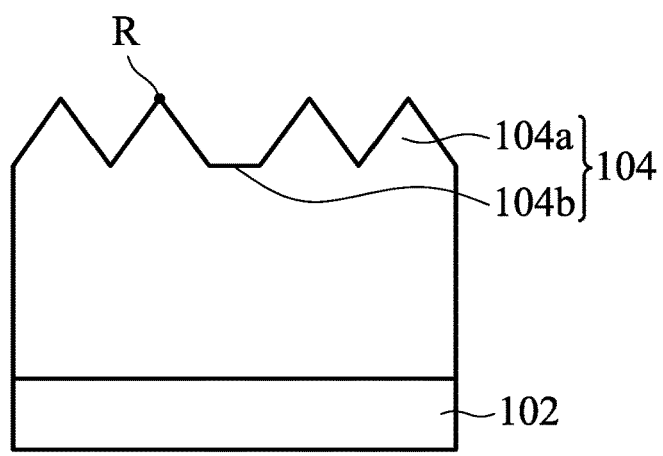

Afterwards, as shown in FIG. 4B, the semiconductor layer 104 is patted to form a number of hill portions 104a and a flat portion 104b. The difference between FIG. 4B and FIG. 1B is that the top surface of the flat portion 104b is lower than the tip R of each of the hill portions 104a.

Figure 4C:
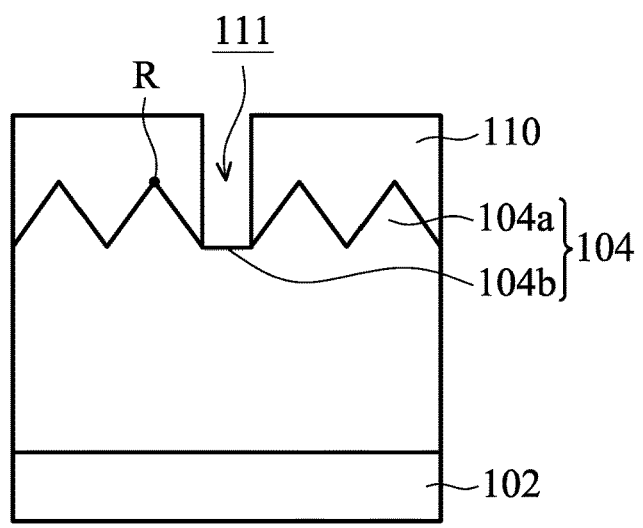

Next, as shown in FIG. 4C, the second photoresist layer 110 is formed over the semiconductor layer 104, in accordance with some embodiments of the disclosure. Next, a portion of the second photoresist layer 110 is removed to form an opening 111. The flat portion 104b is exposed by the opening 111.

Figure 4D:
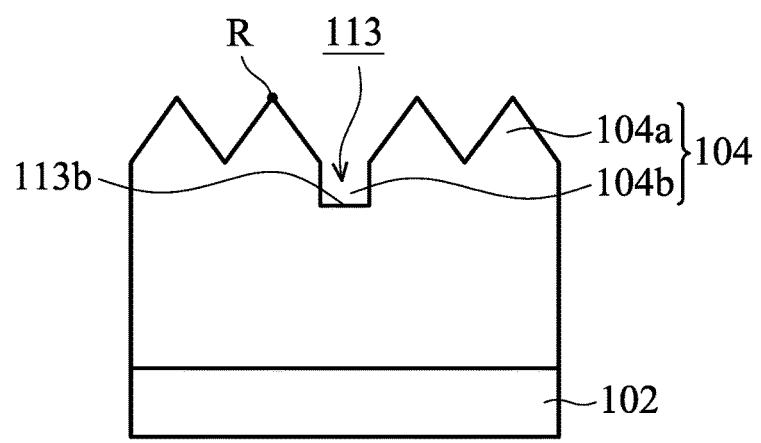

Afterwards, as shown in FIG. 4D, an etching process is performed to remove a portion of the exposed flat portion 104b and to form a trench 113, in accordance with some embodiments of the disclosure. As a result, a bottom surface 113b of the trench 113 is lower than the tip R of the hill portions 104a of the semiconductor layer 104. The bottom surface 113b of the trench 113 is a planar surface.

Figure 4E:
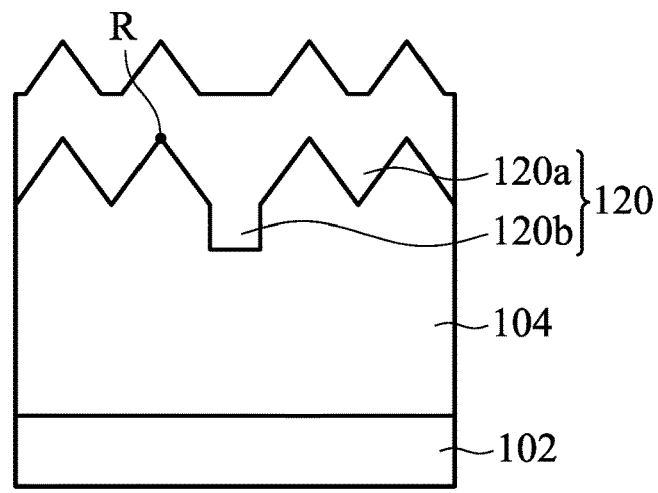

Afterwards, as shown in FIG. 4E, the dielectric layer 120 is formed in the trench 113 and over the hill portions 104a of the semiconductor layer 104, in accordance with some embodiments of the disclosure. As a result, the dielectric layer 120 includes a number of protrusion portions 120a and a pillar portion 120b adjoined to the protrusion portions 120a. The pillar portion 120b is extended from the protrusion portions 120b.

Figure 4F:
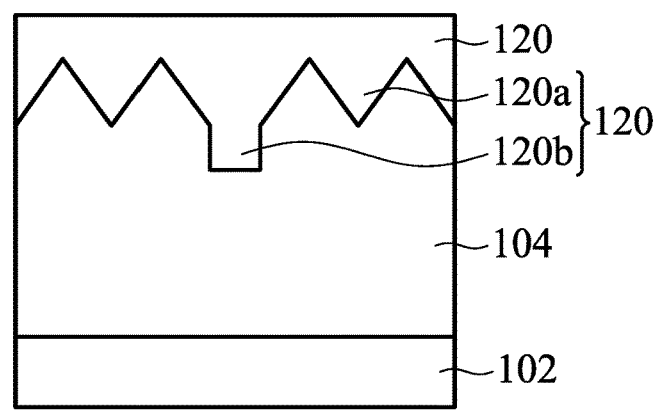

Next, as shown in FIG. 4F, the dielectric layer 120 is planarized to form a planar top surface, in accordance with some embodiments of the disclosure. In some embodiments, the dielectric layer 120 is planarized by a chemical mechanical polishing (CMP) process to have a planar top surface.

Figure 4G:
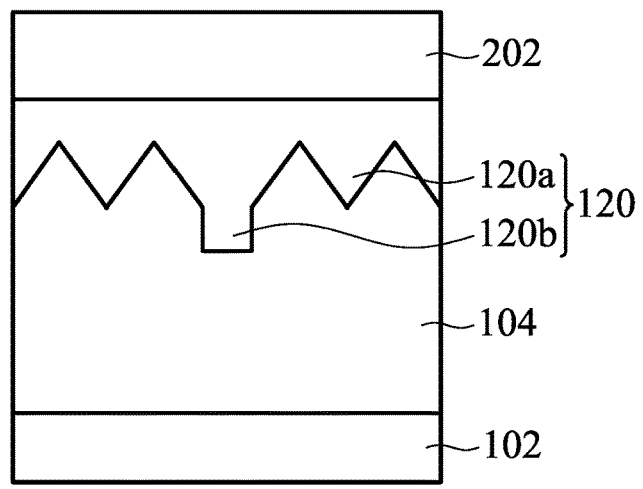

Next, as shown in FIG. 4G, the second substrate 202 is formed over the planar top surface of the dielectric layer 120, in accordance with some embodiments of the disclosure. In some embodiments, the second substrate 202 is bonded to the dielectric layer 120 by any suitable operation, such as oxide-to-oxide fusion bonding, adhesive bonding, vacuum bonding, anodic bonding or another applicable process.

Afterwards, the second substrate 202 is flipped and the first substrate 102 is removed, in accordance with some embodiments of the disclosure. After flipping the second substrate 202, the first substrate 102 is disposed at a top while the second substrate 202 is disposed at a bottom. As a result, the second substrate 202 has the first surface 202a (or front side 202a) facing upward and the bottom surface 202b (or backside 202b) facing downward. The flipping of the second substrate 202 facilitates subsequent operations on the first surface 202a of the second substrate 202. In addition, a portion of the dielectric layer 104 is removed.

Figure 4H:
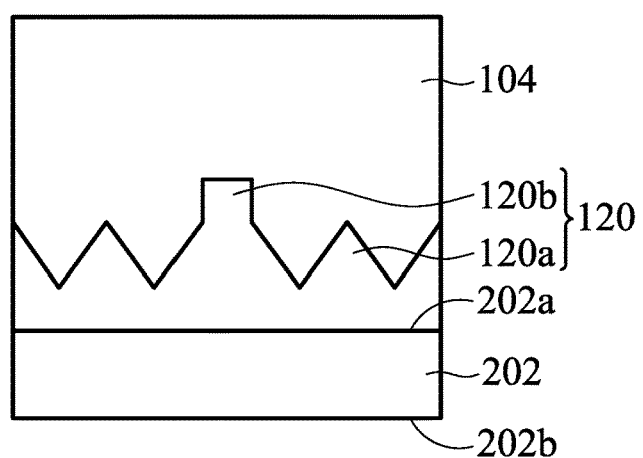

As shown in FIG. 4H, the dielectric layer 120 is formed over the first surface 202a of the second substrate 202. The dielectric layer 120 has a continuous structure. The protrusion portions 120a have a triangular, conical, concave, wave or trapezoidal shape when seen from a cross-sectional view. A top surface of the pillar portion 120b is higher than a top surface of the protrusion portions 120a. Each of the protrusion portions 120a has a fourth height H4, and the pillar portion 120b has a fifth height H5 which is greater than the fourth height H4.

Figure 5A:
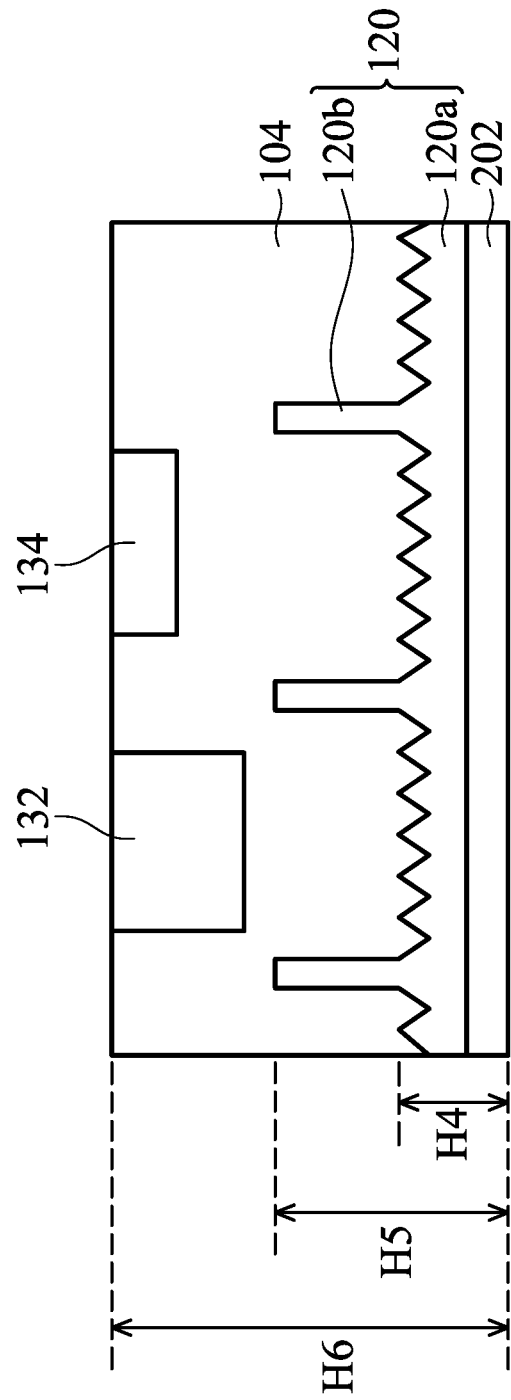
FIGS. 5A-5C show cross-sectional representations of various stages of forming an FSI image sensor device structure, in accordance with some embodiments of the disclosure.
Figure 5B:
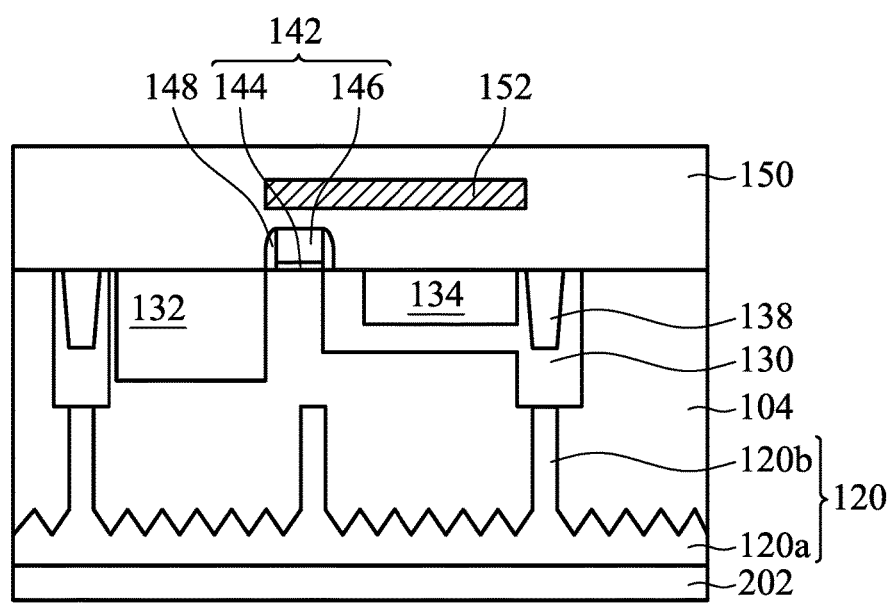
Figure 5C:
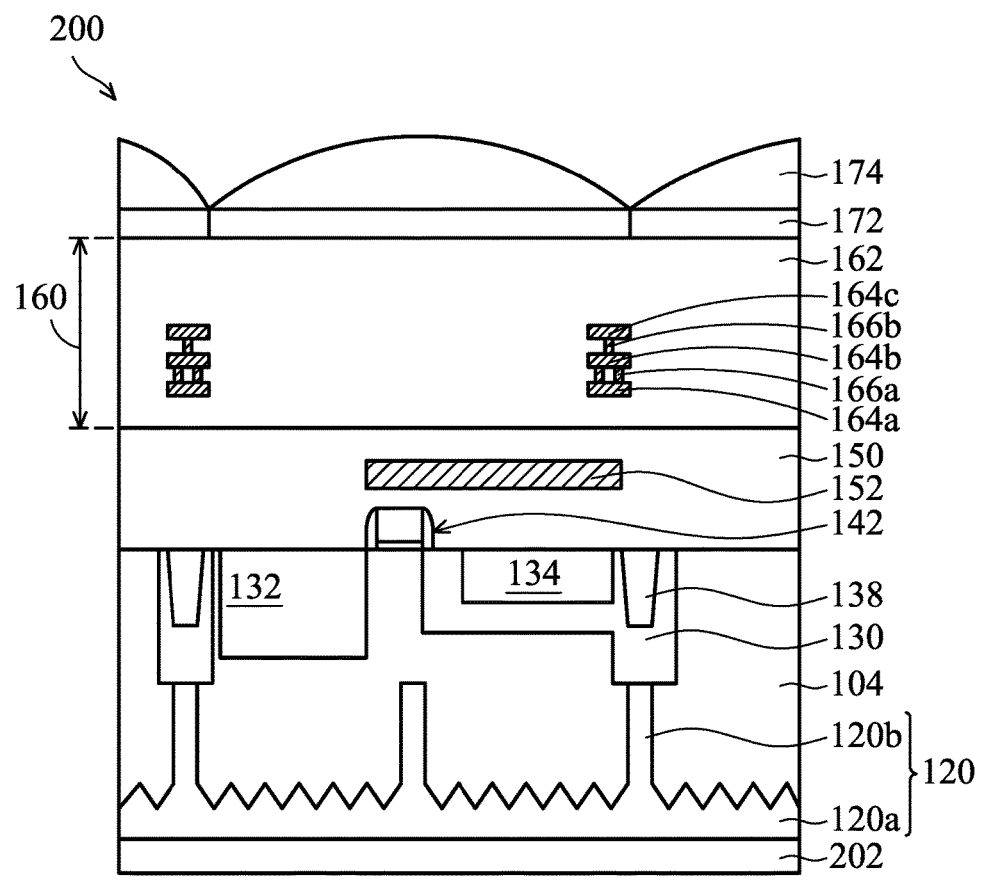
Figure 5C:
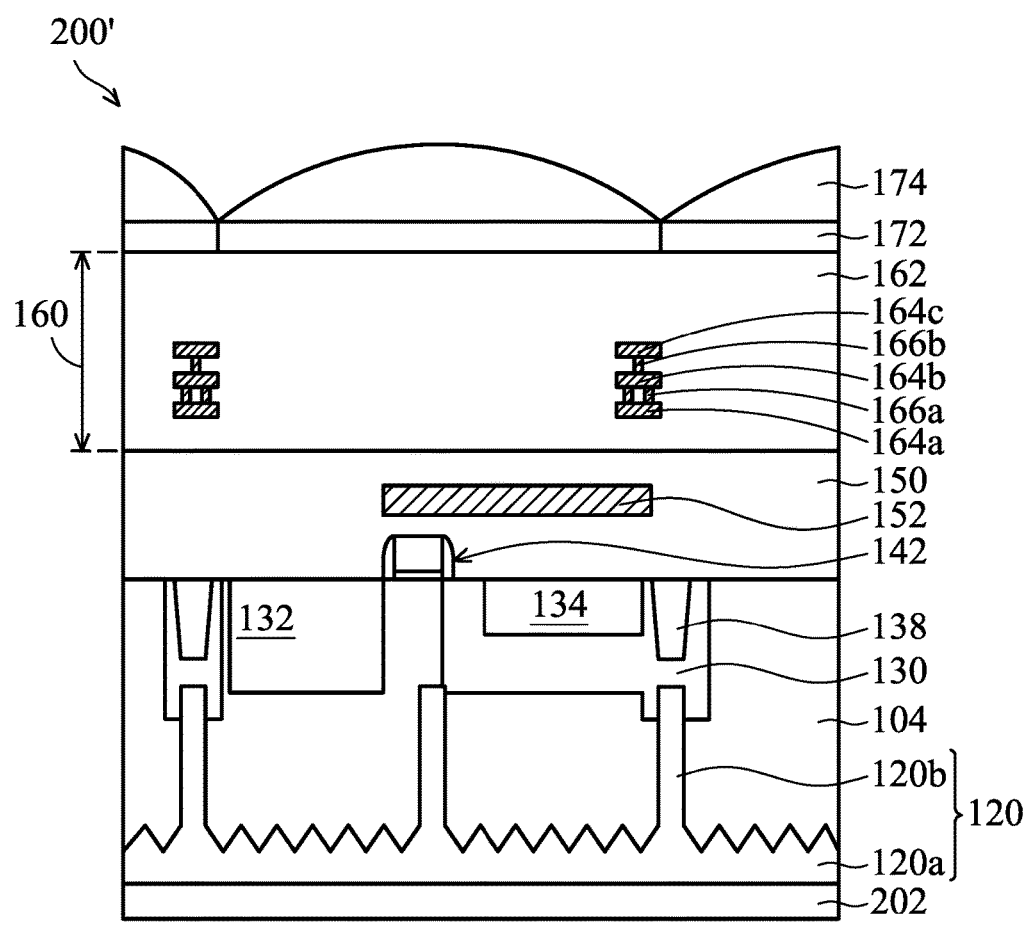

FIGS. 5A-5C show cross-sectional representations of various stages of forming an FSI image sensor device structure 200, in accordance with some embodiments of the disclosure.

The dielectric layer 120 and the second substrate 202 shown in FIG. 5A are formed by the processes shown in FIGS. 4A-4H. The pixel region 132 and the storage region 134 are formed in the semiconductor layer 104 and above the dielectric layer 120. The pillar portion 120b is configured to prevent the light entering into the storage region 134.

In some embodiments, the protrusion portions 120a are consistently spaced from each other. In some embodiments, each of the protrusion portions 120a has substantially the same size, dimensions and shape. Each of the protrusion portions 120a has a fourth height H4, and the pillar portion 120b has a fifth height H5 which is greater than the fourth height H4. The semiconductor layer 104 has a sixth height H6 measured from a top surface of the semiconductor layer 104 to the first surface 202a of the second substrate 202. In some embodiments, a ratio of the fifth height H5 of the pillar portions 120b to the fifth height H6 is in a range from about 0.3 to about 0.9. When the height ratio (H5/H6) is within above-mentioned range, the quantum efficiency of the FSI image sensor device structure 100 is improved and crosstalk is reduced. Furthermore, the global shutter efficiency of the FSI image sensor device structure 200 is increased.

Afterwards, as shown in FIG. 5B, the well region 130 and the isolation structure 138 are formed in the semiconductor layer 104. The transistor structure 142 and the inter-layer dielectric (ILD) layer 150 are formed over the semiconductor layer 104. The shield structure 152 is formed in the ILD layer 150.

Next, as shown in FIG. 5C, the interconnect structure 160 is formed over the ILD layer 150, and the color filter layer 172 is formed over the interconnect structure 160. The microlens structure 174 is formed over the color filter layer 172.

Figure 6:
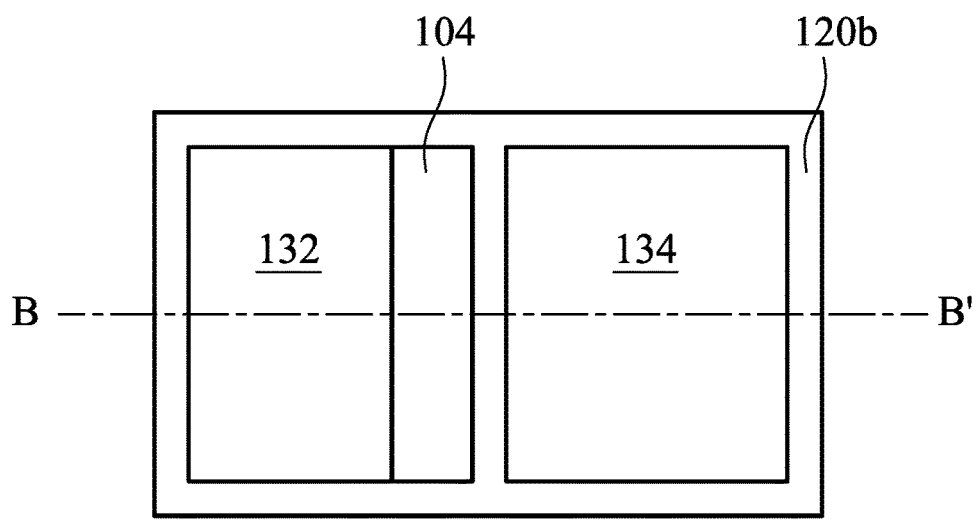
FIG. 6 shows a top view representation of the structure of FIG. 5A, in accordance with some embodiments of the disclosure.

FIG. 6 shows a top view representation of the structure of FIG. 5A, in accordance with some embodiments of the disclosure. FIG. 5A is a cross-sectional representation taken along the BB' line of FIG. 6.

The pillar portions 120b form a ring-shaped structure when seen from a top-view to isolate the pixel region 132 and the storage region 134. In some embodiments, the pillar portions 120b surround the pixel region 132. In some other embodiments, the pillar portions 120b surround the storage region 134.

The pillar portions 120b surround the pixel region 132 and therefore the pixel region 132 is separated from the storage region 134 by the pillar portions 120b. Therefore, the dielectric layer 120 (or the barrier structure) performs the function of reflecting the incident light and preventing stray light from entering the storage region 134. Accordingly, the quantum efficiency of the FSI image sensor device structure 200 is improved and crosstalk is reduced. Furthermore, the global shutter efficiency of the FSI image sensor device structure 200 is increased.

FIG. 5C' shows a cross-sectional representation of an FSI image sensor device structure 200', in accordance with some embodiments of the disclosure. FIG. 5C' is similar to FIG. 5C, the difference between FIG. 5C' and FIG. 5C is that a portion of the pillar portions 120b is embedded in the well region 130.

Embodiments for forming an FSI image sensor device structure and method for formation of the same are provided. The FSI image sensor device structure includes a pixel region and a storage region adjacent to the pixel region. The FSI image sensor device structure further includes a barrier structure formed below the pixel region and the storage region. The barrier structure includes a number of protrusion portions and a number of pillar portions. The unwanted stray light is reflected by the protrusion portions, and is blocked by the pillar portions. The pixel region is surrounded by the pillar portions with a ring-shaped structure when seen from a cross-sectional view. The barrier structure is configured to prevent the stray light entering the storage region. Therefore, the quantum efficiency of the FSI image sensor device structure is improved and crosstalk is reduced. In addition, the global shutter efficiency is increased and the performance of the FSI image sensor device structure is improved.

In some embodiments, an FSI image sensor device structure is provided. The FSI image sensor device structure includes a substrate and a barrier structure formed in the substrate. The barrier structure includes a plurality of protrusion portions and a plurality of pillar portions, each of the protrusion portions has a first height, and each of the pillar portions has a second height that is greater than the first height. The FSI image sensor device structure includes a pixel region formed over the protrusion portions and a storage region formed over the protrusion portions, wherein the pillar portions surround the pixel region.

In some embodiments, an FSI image sensor device structure is provided. The FSI image sensor device structure includes a substrate and a barrier structure formed in the substrate. The barrier structure comprises a plurality of protrusion portions and a plurality of pillar portions. The FSI image sensor device structure includes a pixel region formed over the protrusion portions and a storage region formed over the protrusion portions. The FSI image sensor device structure further includes a well region surrounding the storage region, and the pillar portions are extended from the protrusion portions to the well region.

In some embodiments, a method for forming an FSI image sensor device structure is provided. The method includes forming a semiconductor layer over a first substrate, and the semiconductor layer includes a plurality of hill portions and a plurality of flat portions between two adjacent hill portions. The method also includes forming a photoresist layer on a portion of the semiconductor layer to expose a portion of the flat portions and etching a portion of the semiconductor layer by using the photoresist layer as a mask to form a plurality of trenches. The method includes forming a dielectric layer over the hill portions and in the trenches and removing a portion of the dielectric layer to form a barrier structure, such that the barrier structure has a planar top surface. The method further includes forming a second substrate over the planar top surface of the barrier structure and removing the first substrate to expose the semiconductor layer. The barrier structure includes a plurality of protrusion portions and a plurality of pillar portions adjoining the protrusion portions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A front side illuminated (FSI) image sensor device structure, comprising:
   a substrate;
   a barrier structure formed in the substrate, wherein the barrier structure comprises a plurality of protrusion portions and a plurality of pillar portions, each of the protrusion portions has a first height, and each of the pillar portions has a second height that is greater than the first height;
   a pixel region formed over the protrusion portions; and
   a storage region formed over the protrusion portions, wherein the pillar portions surround the pixel region.

2. The front side illuminated (FSI) image sensor device structure as claimed in claim 1, wherein the pillar portions form a ring-shaped structure when seen from a cross-sectional view.

3. The front side illuminated (FSI) image sensor device structure as claimed in claim 1, further comprising:
   a transistor structure formed over the protrusion portions; and
   a shield structure formed over the transistor structure, wherein the shield structure covers the transistor structure and the storage region.

4. The front side illuminated (FSI) image sensor device structure as claimed in claim 1, further comprising:
   a well region formed in the substrate, wherein the pillar portions are in direct contact with the well region.

5. The front side illuminated (FSI) image sensor device structure as claimed in claim 4, wherein a portion of the pillar portions is embedded in the well region.

6. The front side illuminated (FSI) image sensor device structure as claimed in claim 1, further comprising:
   an interconnect structure formed over the pixel region;
   a color filter layer formed over the interconnect structure; and
   a microlens structure over the color filter layer.

7. The front side illuminated (FSI) image sensor device structure as claimed in claim 6, wherein the interconnect structure comprises a plurality of conductive lines, wherein the conductive lines are directly above the pillar portions.

8. The front side illuminated (FSI) image sensor device structure as claimed in claim 1, wherein the protrusion portions and the pillar portions form a continuous structure, and the protrusion portions have a triangular, conical, concave, wave or trapezoidal shape when seen from a cross-sectional view.

9. The front side illuminated (FSI) image sensor device structure as claimed in claim 1, wherein the pillar portions are extended from the protrusion portions.

10. A front side illuminated (FSI) image sensor device structure, comprising:
    a substrate;
    a barrier structure formed in the substrate, wherein the barrier structure comprises a plurality of protrusion portions and a plurality of pillar portions;
    a pixel region formed over the protrusion portions;

a storage region formed over the protrusion portions; and a well region surrounding the storage region, wherein the pillar portions are extended from the protrusion portions to the well region.

11. The front side illuminated (FSI) image sensor device structure as claimed in claim 10, wherein the pixel region is surrounded by the pillar portions.

12. The front side illuminated (FSI) image sensor device structure as claimed in claim 10, further comprising:

a shield structure formed over the storage region, wherein the pillar portions surround the shield structure.

13. The front side illuminated (FSI) image sensor device structure as claimed in claim 10, further comprising:

an interconnect structure formed over the pixel region;

a color filter layer formed over the interconnect structure; and a microlens structure over the color filter layer.

14. The front side illuminated (FSI) image sensor device structure as claimed in claim 10, wherein the protrusion portions and the pillar portions form a continuous structure.

15. The front side illuminated (FSI) image sensor device structure as claimed in claim 10, wherein the pillar portions form a ring-shaped structure when seen from a cross-sectional view.

16. The front side illuminated (FSI) image sensor device structure as claimed in claim 10, wherein the pixel region is separated from the storage region by the pillar portions.

17. A front side illuminated (FSI) image sensor device structure, comprising:

a first pillar portion formed over a substrate;

a second pillar portion formed over the substrate, wherein the first pillar portion and the second pillar portion form a ring-shaped structure;

a plurality of protrusion portions formed over the substrate, wherein the protrusion portions are between the first pillar portion and the second pillar portion, and the protrusion portions are lower than the first pillar portion and the second pillar portion;

a pixel region formed over the protrusion portions, wherein the pixel region is surrounded by the ring-shaped structure;

an interconnect structure formed over the pixel region; and a color filter layer formed over the interconnect structure.

18. The front side illuminated (FSI) image sensor device structure as claimed in claim 17, further comprising:

a third pillar portion formed over the substrate, wherein the second pillar portion and the third pillar portion form a ring-shaped structure; and a storage region formed between the second pillar portion and the third pillar portion.

19. The front side illuminated (FSI) image sensor device structure as claimed in claim 18, further comprising:

a shield structure formed over the storage region, wherein the second pillar portion and the third pillar portion surround the shield structure.

20. The front side illuminated (FSI) image sensor device structure as claimed in claim 17, further comprising:

a well region formed over the substrate, wherein the first pillar portion is in direct contact with the well region.

* * * * *